United States Patent
Hsu et al.

(10) Patent No.: US 7,145,413 B2
(45) Date of Patent: Dec. 5, 2006

(54) PROGRAMMABLE IMPEDANCE MATCHING CIRCUIT AND METHOD

(75) Inventors: Louis L. Hsu, Fishkill, NY (US); Joseph Natonio, Poughkeepsie, NY (US); Daniel W. Storaska, Walden, NY (US); William F. Washburn, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/250,177

(22) Filed: Jun. 10, 2003

(65) Prior Publication Data

US 2004/0251983 A1    Dec. 16, 2004

(51) Int. Cl.
*H03H 7/38*    (2006.01)

(52) U.S. Cl. .................... 333/33; 333/32; 333/17.3; 455/125

(58) Field of Classification Search ............. 333/17.3, 333/32, 33; 455/125
See application file for complete search history.

(56) References Cited

U.S. PATENT DOCUMENTS

| | | | |
|---|---|---|---|
| 3,775,707 A * | 11/1973 | Frazier | 333/32 |
| 3,893,048 A | 7/1975 | Lieberman | |
| 4,479,100 A | 10/1984 | Moghe et al. | 333/33 |
| 4,625,184 A | 11/1986 | Nütsuma et al. | |
| 5,065,132 A * | 11/1991 | Taddiken et al. | 338/334 |
| 5,239,289 A | 8/1993 | Ferraiolo et al. | |
| 5,270,667 A | 12/1993 | Upton | |
| 5,808,527 A * | 9/1998 | De Los Santos | 333/205 |
| 5,872,489 A | 2/1999 | Chang et al. | 331/179 |
| 5,973,567 A | 10/1999 | Heal et al. | 330/286 |
| 5,994,985 A | 11/1999 | Pehlke et al. | |
| 6,114,938 A | 9/2000 | Iida et al. | |
| 6,121,850 A | 9/2000 | Ghoshal | |
| 6,127,908 A * | 10/2000 | Bozler et al. | 333/246 |
| 6,140,885 A | 10/2000 | Abadeer et al. | 333/17.3 |
| 6,259,334 B1 | 7/2001 | Howald | 333/17.3 |
| 6,268,774 B1 | 7/2001 | Soumyanath | |
| 6,356,149 B1 | 3/2002 | Stengel et al. | |
| 6,369,683 B1 | 4/2002 | Iida et al. | |
| 6,396,368 B1 | 5/2002 | Chow et al. | 333/262 |
| 6,414,562 B1 | 7/2002 | Bouisse et al. | |
| 6,437,653 B1 | 8/2002 | Cruz et al. | |
| 2001/0045867 A1 | 11/2001 | Miyashita et al. | |

OTHER PUBLICATIONS

H. O. Askin et al., "Printed Inductor with Shorting Bars Deletable by Laser for Adjusting the Value of Inductance", IBM Technical Disclosure Bulletin, vol. 28, No. 7, Dec. 1985, p. 3194-3195.
A. A. Mello, "Programmable Substrate Inductor", IBM Technical Disclosure Bulletin, vol. 32, No. 6B, Nov. 1989, p. 310-317.

* cited by examiner

Primary Examiner—Stephen E. Jones
(74) Attorney, Agent, or Firm—Daryl K. Neff

(57) ABSTRACT

As disclosed herein, a microelectronic circuit and method are provided for improving signal integrity at a transmission line. The circuit includes a programmably adjustable impedance matching circuit which is coupled to a transmission line which includes a programmably adjustable inductive element. The programmably adjustable impedance matching circuit is desirably provided on the same chip as a receiver or transmitter to which the transmission line is coupled, or alternatively, on an element packaged together with the chip that includes the receiver or transmitter. The impedance of the programmably adjustable impedance matching circuit is adjustable in response to control input to improve signal integrity at the transmission line.

9 Claims, 9 Drawing Sheets c0  c1  c2

PROGRAMMABLE IMPEDANCE MATCHING CIRCUIT AND METHOD

BACKGROUND OF INVENTION

The present invention relates to fabrication of microelectronic circuits and more particularly to a structure and method for programmably adjusting a matched impedance to reduce signal reflection at an interface to a transmission line.

The continuous increase in the speed and complexity of digital communication systems leads to a strong demand for improved methods of data transmission in these systems. One challenge is the presence of reflection along transmission lines that carry data between components of the system. A reflection is a return of energy (i.e. electromagnetic energy) caused by an impedance mismatch occurring along a transmission line. Stated another way, any pulse or signal propagating along a transmission line will reflect at any point where the transmission line becomes different.

Many things can lead to impedance mismatch and, therefore, reflection along a transmission line. For example, variations in manufacturing process can cause elements of a microelectronic package that should be identical to vary from one to another, resulting in certain components having higher or lower impedance than desired. Wiring and interconnections in the microelectronic package and even printed wiring boards and passive components are all subject to variations in the manufacturing process and changes due to temperature, thus contributing to impedance mismatch and jitter noise.

No matter what the exact cause of the reflection is, it is important to keep reflection along transmission lines to a minimum. Depending on the strength of the transmitted signal and the ratio of the transmitted signal to the reflected signal, the transmitted signal and the reflected signal may either cancel each other out or otherwise interfere. The conventional solution to address reflection is to terminate the transmission line in an impedance matched to the characteristic impedance of the transmission line. Such matched impedance is ordinarily provided in form of a resistor, known as a termination resistor.

Ideally, the circuitry within an integrated circuit (hereinafter "IC" or "chip") which is responsible for transmitting or receiving off the chip must be designed in a way that addresses reflection and impedance mismatch. Although these concerns are addressed somewhat by use of on-board termination resistors to terminate transmission lines, there are problems that hinder achievement of this goal. Most IC's are designed so that the IC communicates with off-chip devices through metallization patterns on the exterior of the chip known as signal pads. For communication between the chip and off-chip circuitry, input output (I/O) interface circuits transmit and receive data through the signal pads. The signal pads of like and/or different chips are connected together by transmission lines on one or more printed wiring boards and/or wires or cables within or between communication systems, thereby allowing communications between the various chips of a system and/or between a plurality of systems.

Difficulties in chip design arise when the length of on-chip wiring between input output (I/O) devices and the bonding pads causes such on-chip wiring to act more like a transmission line, affecting signal integrity. The impedance of the on-chip wiring, as well as its length in such instances becomes considerable due to layout and pad limitation. The problem is further aggravated by parasitic effects, that is the of unwanted resistive, capacitive and/or inductive elements of the chip or package. This is especially true when a large size device is added to protect the chip from being damaged by an unexpected high current surge, such as for electrostatic discharge protection. In such instances, a simple termination resistor will not adequately provide a matching impedance to the characteristic impedance $Z_O$, of the transmission line because the large size ESD device adds a reactive (inductive or capacitive) term that cannot be matched with a resistor alone.

Many approaches have been used to reduce reflection that occurs at interfaces to transmission lines. In one approach, a transmission line is terminated in an impedance that is matched to that of the transmission line. For example, for a pair of transmission lines on which differential signals are transmitted, a pair of termination resistors, each having a value of "R" corresponding to the characteristic impedance "$Z_O$" of one of the transmission lines are placed across the transmission lines to terminate the pair. Thus, if the characteristic impedance of a transmission line is 50 ohms, then the termination resistor R is set to 50 ohms. However, there is a problem with this approach in that the impedance of elements at the input interface other than the termination resistor can vary, and therefore affect the value of the terminating impedance. Because of this, signal reflection in such systems contributes to a significant portion of signal loss, especially when signal frequency is in the high radio frequency (RF) range or microwave frequency domain.

Further, in the above approach, electronic circuits can be impedance matched to the transmission line only if the number of electronic circuits coupled to the line and the input impedance of such circuits remains fixed. In a complex system having many components, however, the number of electronic circuits coupled to transmission lines can frequently vary. When the number of circuits change, or the termination impedance of the circuits change, impedance mismatch is likely. By way of an example, suppose that a number of memory modules of a computer system are coupled to a memory controller through a data bus and an address bus, and the terminating impedance of the memory modules is matched to the buses when the computer system is initially placed in service. However, when additional memory modules are coupled later to the buses, because there are more components then, the buses might no longer be terminated in matched impedances.

A different approach to reducing reflections at component interfaces has been to seek targets for terminating a transmission line, given a characteristic impedance $Z_O$, through careful control over the terminating impedance, as designed into high-quality package components such as bonding pads, wires, balls and other chip components. In such an approach, the values of resistance, impedance and capacitance (R, L and C respectively) of each chip and package are carefully controlled for the set of frequencies over which the chip operates. Material compatibility, cost, and process variation, among other factors, have so far not yielded a practical and cost-effective solution.

Consequently, a need exists for a practical solution to dynamically minimize system reflections and impedance mismatch at component interfaces to transmission lines.

SUMMARY OF INVENTION

According to an aspect of the invention, a microelectronic circuit is provided for improving signal integrity at a transmission line. The circuit includes a programmably adjustable impedance matching circuit coupled to a transmission line which includes a programmably adjustable inductive element. The impedance of the programmably adjustable impedance matching circuit is adjustable in response to control input to improve signal integrity at the transmission line.

DETAILED DESCRIPTION

Figure 1:
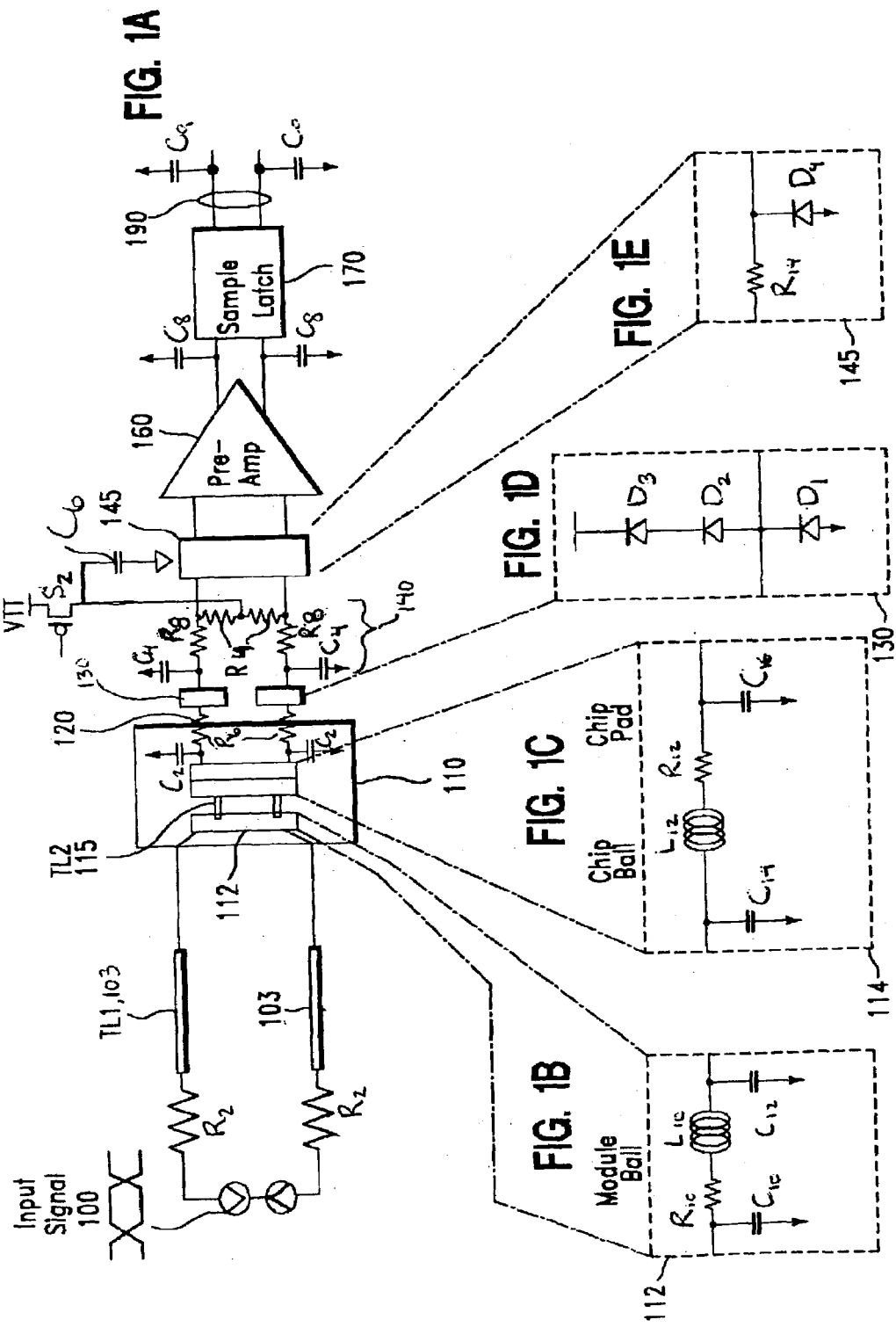
FIG. 1A is a circuit schematic diagram illustrating an IC receiver and package, as coupled to a transmission line.
FIG. 1B is a circuit schematic diagram illustrating a circuit equivalent for a module ball component of the package of the IC receiver shown in FIG. 1A.
FIG. 1C is a circuit schematic diagram illustrating a circuit equivalent for chip ball and chip pad components of the IC receiver shown in FIG. 1A.
FIG. 1D is a circuit schematic diagram illustrating an electrostatic discharge (ESD) protection circuit of the IC receiver shown in FIG. 1A.
FIG. 1E is a circuit schematic diagram illustrating a secondary ESD protection circuit of the IC receiver shown in FIG. 1A.
Figure 2:
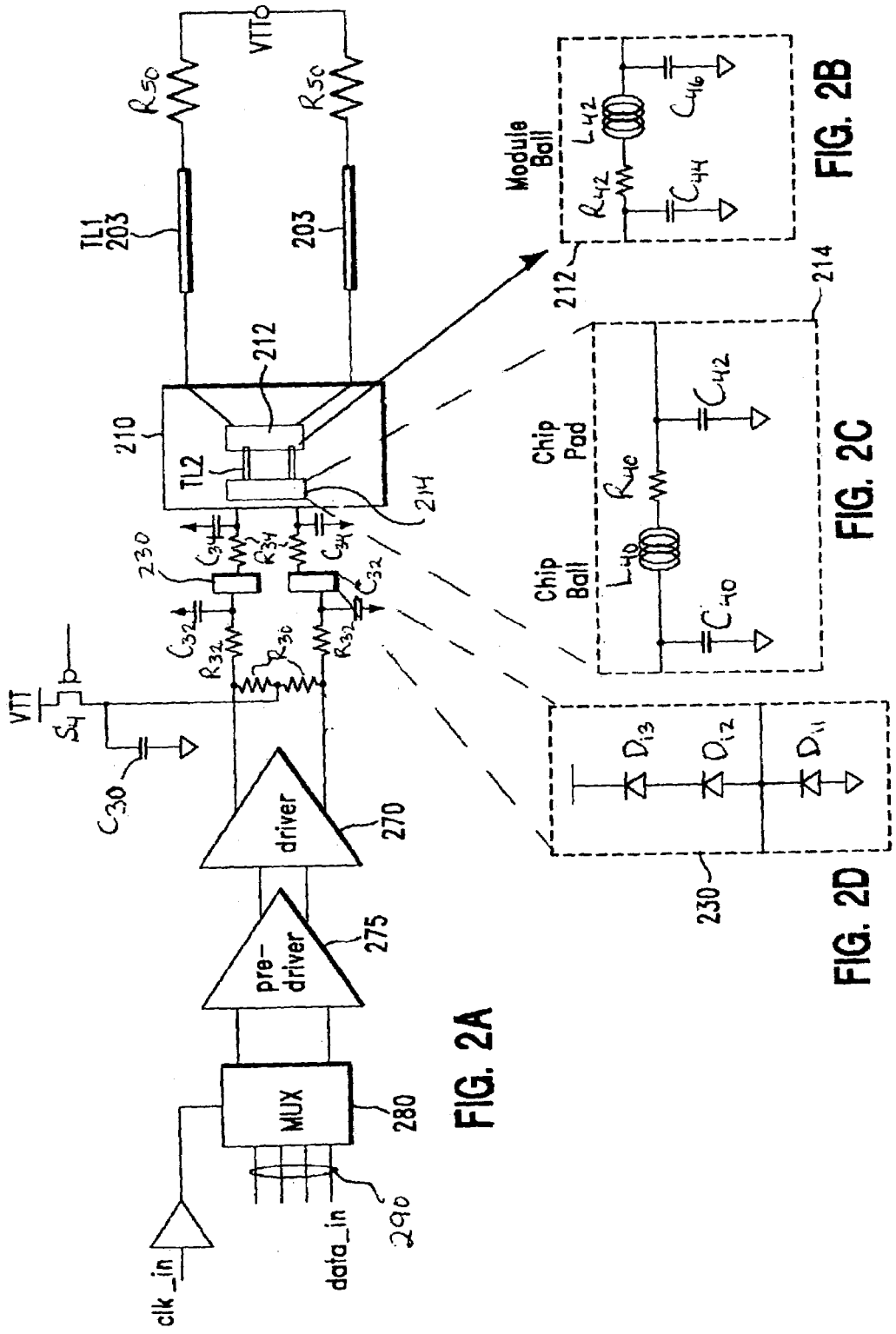
FIG. 2A is a circuit schematic diagram illustrating an IC transmitter and package, as coupled to a transmission line.
FIG. 2B is a schematic diagram illustrating a circuit equivalent for a module ball component of the package of the IC transmitter shown in FIG. 2A.
FIG. 2C is a schematic diagram illustrating a circuit equivalent for chip ball and chip pad components of the IC transmitter shown in FIG. 2A.
FIG. 2D is a circuit schematic diagram illustrating a circuit equivalent for an ESD protection circuit of the IC transmitter shown in FIG. 2A.

In systems including many active electronic components, signals are transmitted from a transmitter formed on one chip or component to a receiver formed on another chip or component through transmission lines that connect the two chips or components. FIGS. 1A and 2A respectively illustrate such receiver and transmitter, modeled as networks. It is important to study the structure of such networks, in order to understand the source of signal reflections, since the invention provides ways of reducing impedance mismatches and reflections.

In the receiver network of FIG. 1A, a differential signal 100 having true and complementary signals is coupled through a pair of source resistors R2 to a pair of transmission lines (TL1) 103, each having a characteristic impedance $Z_O$. Each transmission line (TL1) 103, in turn, is coupled to the receiver through a package 110, e.g. a ball grid array package, which includes a module ball 112, for which a circuit equivalent is shown in FIG. 1B modeled as a series resistor R10, series inductor L10, and shunt capacitors C10 and C12. Also included in the package 110 are second transmission lines (TL2) 115, and a chip interconnection, e.g. chip pad and ball 114 coupled to each second transmission line, for which a circuit equivalent is shown in FIG. 1C modeled as a series inductor L12, series resistor R12 and shunt capacitors C14 and C16.

The chip pad and ball 114 coupled to each second transmission line TL2, is coupled, in turn, to a section of on-chip wiring 120, modeled as a shunt capacitor C2 and a series resistor R6, then to an ESD (electrostatic discharge) protection circuit 130, for which a circuit equivalent is shown in FIG. 1D including a reverse-biased diode D1 between each signal line and ground, in parallel with a series of normally off (because of the normally lower signal potential) forward-biased diodes D2 and D3 between the signal line and the supply voltage VTT.

The ESD circuit 130, in turn, is connected to a further section of wiring 140, modeled as a shunt capacitor C4 and a series resistor R8. Terminating resistors R4 are coupled between each signal line of the pair and a supply voltage VTT, which can be selectively removed from the circuit by a switch S2. A decoupling capacitor C6 is further coupled to the voltage supply end of resistors R4. A secondary ESD circuit 145, for which a circuit equivalent is provided in FIG. 1E, modeled as a series resistor R14 and reverse-biased diode D4, is coupled to each signal line following the termination resistors R4. Each signal line is further coupled to a preamplifier 160, which, in turn, is coupled to a sample latch 170, at the input of which is a shunt capacitor C8. A sampled differential signal 190 is ultimately obtained at the output of sample latch 170 on lines having shunt capacitances modeled as C9.

The minimum wiring length is determined by the distance of the chip pad to other elements with which it contacts, which ultimately affect its characteristics, as represented by the distributed RC network in FIG. 1A. The capacitance value of the ESD devices 130 varies depending on the technology and the size of the device. It is common, however, that most ESD circuits add a shunt capacitance of between 1 pF and 2.5 pF. This shunt capacitance is in addition to the input capacitance of the amplifier itself. Because of this capacitance, which adds a reactive term to the impedance, the termination resistors R4, having only a resistive component, e.g. 50 ohms, may not be sufficient to minimize signal loss due to the reflection at the input interface of the receiver.

FIG. 2A is a block and schematic diagram illustrating a transmitter and associated circuitry. Transmitters and receivers have complementary functions, and therefore some of the elements that are provided in the receiver shown in FIG. 1A are also present in the transmitter of FIG. 2A. In FIG. 2A, parallel signal lines 290 are coupled to a multiplexer 280 operated by a clock CLK_IN, which, in turn, is coupled to provide serialized signals to a pre-driver 275. The pre-driver, in turn, is coupled to a driver 270 which provides output onto a pair of differential signal lines which are terminated by a pair of resistors R30, each of which is switchably coupled to a supply voltage VTT through a switch S4. A decoupling capacitor C30 is also provided on the supply voltage ends of the resistors R30. Each of the differential outputs of the driver 270 is further coupled to on-chip wiring which is modeled as a series resistor R32 and a shunt capacitor C32.

An ESD protection circuit 230 is further coupled to each of the differential signal lines, and is modeled as a reverse-biased diode to ground D11, in parallel with a series of normally off (because of the normal signal potential), forward-biased diodes D12 and D13 between the differential signal line and the supply voltage VTT. The ESD protection circuit 230 is followed by more on-chip wiring modeled as a series resistor R34 and shunt capacitor C34, which, in turn, is coupled to the package 210, which is modeled as having a chip ball and chip pad component (FIG. 2C), having shunt capacitors C40 and C42, series inductor L40 and series resistor R40, a transmission line TL2, and a module ball component (FIG. 2B) which is modeled as shunt capacitors C44 and C46, a series resistor R42 and a series inductor L42. The outputs of the package, in turn, are coupled to transmission lines (TL1) 203, which, in turn, are coupled at a far end across resistors R50 to a supply voltage VTT for terminating the far end of transmission lines 203.

In a transmitting operation, MUX 280 latches signals on the parallel signal lines 290 into a shift register and outputs them serially as a pair of differential signals on a pair of lines. The differential signals, in turn, are provided to a pre-driver 275 which provides amplified signal output to a main driver 270. The driver 270 amplifies the differential signals again and outputs them onto a pair of differential signal lines which are coupled to additional structure as described above, which ultimately result in the driving of amplified differential signals onto transmission lines (TL1) 203. As described above relative to the transmitter of FIG. 1, wiring and the ESD load contributes to shunt reactance of the network, which must be compensated somehow, in order to achieve full impedance matching at the interface to the transmission line.

Referring again to FIG. 1A, signal loss due to reflection can only be partially corrected by tuning the resistance value of the termination resistors R4. If nothing else is done, the termination resistors R4 can only partially address the signal return loss. Tables 1 and 2 provide examples showing the inadequacies of such termination resistors R4 for provided a matched impedance.

Table 1 charts changes in signal eye characteristics that are obtained for different values of termination resistances for transient analysis conducted at 1.25 GHz. The signal eye opening represents the minimum time interval and minimum difference between high and low signal levels that are sustainable over relatively large numbers of signal cycles. Jitter is the tendency for the timing of signal transitions and signal amplitude levels to vary from cycle to cycle. Jitter reduces the signal eye opening, and in sufficient magnitude, jitter tends to cause errors to occur when receiving data signals.

The eye width is defined as the time interval across the eye opening, measured usually at 50% normalized eye amplitude, which is error free up to the specified bit error rate (BER). The eye height is defined as the difference between high and low signal levels as measured at the edge of the eye opening.

Table 1

Receiver Eye Opening Termination Resistance
(Transient Analysis at 1.25 GHz)

| Termination Resistance RX (ohm) | Eye Width (ps) | Eye Height (mV) |
|---|---|---|
| 55 | 150 | 50.13 |
| 50 | 151 | 49.35 |
| 45 | 154 | 48.47 |
| 40 | 154 | 47.20 |
| 35 | 156 | 45.36 |

Table 2 charts deterministic jitter as a function of termination resistance for a transient analysis conducted at 1.25 GHz. Deterministic jitter (DJ) is jitter on a signal waveform that can be reproduced under controlled conditions, but does not include random jitter.

It should be noted that the illustrative sample results provided in Tables 1 and 2 are for a signal at input to a receiver for a 200 mV peak-to-peak incoming data pulse height using an AC coupling mode.

TABLE 2

Receiver Deterministic Jitter vs. Termination Resistance
(Transient Analysis at 1.25 GHz)

| Termination Resistance (ohm) | DJ (ps) Operated in AC mode | DJ (ps) Operated in DC mode |
|---|---|---|
| 60 | 8.62 | 8.60 |
| 55 | 8.60 | 8.58 |
| 52 | 8.59 | 8.57 |
| 50 | 8.57 | 8.56 |
| 48 | 8.57 | 8.55 |
| 45 | 8.55 | 4.69 |
| 40 | 4.65 | 4.60 |
| 38 | 4.61 | 4.53 |
| 35 | 4.58 | 4.53 |
| 32 | 4.57 | 4.47 |

As shown in Tables 1 and 2, by just trimming the resistance from 50 ohms to between 40 ohms and 45 ohms, deterministic jitter is reduced and signal reflections are also reduced. Nonetheless, even under such conditions, the signal loss due to reflection is not fully minimized. The situation becomes worse at higher frequencies when there is longer on-chip wiring or a less robust package design is used.

To minimize signal loss due to reflection, it is imperative for the capacitive reactance to be cancelled by the same value of inductive reactance from a series inductor. This is because a series inductor has an impedance (i.e. $Z=j\omega L$) that varies directly with frequency when placed in series, such that the series inductor counteracts a shunt capacitor, which has an impedance (i.e. $Z=1/j\omega C$) that varies inversely with frequency.

Figure 3:
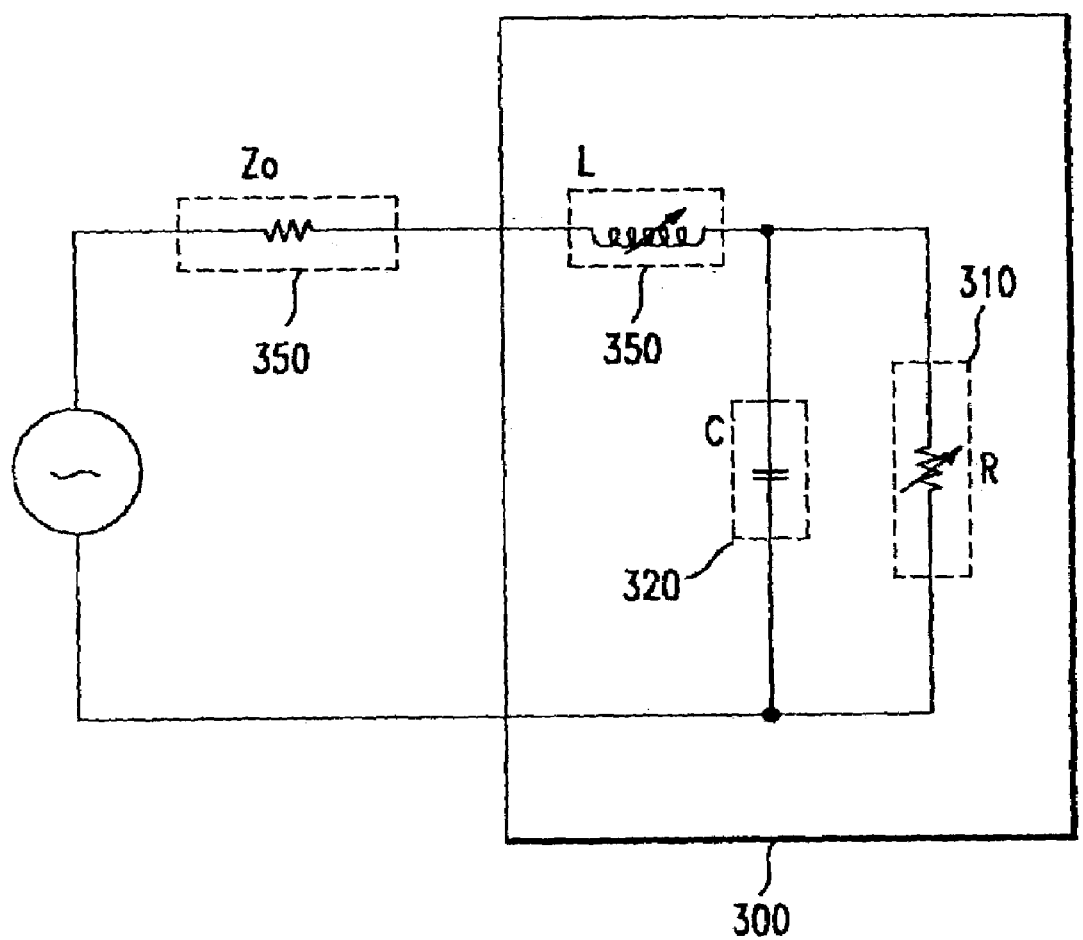
FIG. 3 is a schematic diagram illustrating a series inductance embodiment of the invention, for providing programmably adjustable impedance matching.

FIG. 3 illustrates a first embodiment of the invention for providing a matched impedance by an on-chip programmably adjustable impedance matching circuit. For ease and simplicity of description, circuitry 300 represents a simplified version of impedance elements at an interface between a transmission line and a receiver or a such as those shown in FIGS. 1A and 2A. In this embodiment, as in all other embodiments disclosed herein, the programmably adjustable impedance matching circuit is desirably provided on the same chip as a transmitter or a receiver to which the transmission line is coupled. However, as an alternative, the programmably adjustable impedance matching circuit may be provided on means other than the chip on which the transmitter or receiver is provided, to which the transmission line is coupled. For example, the programmably adjustable impedance element may be provided on a microelectronic element separate from such transmitter or receiver, and the separate element be packaged in an interconnected way together with the chip on which the transmitter or receiver is provided. Inductive or capacitive elements of a programmably adjustable impedance matching circuit may be provided, for example, as conductive traces on an external element, e.g. printed wiring board, auxiliary interconnected element or chip carrier, and programmably controlled by input from a chip, which may be the same chip on which the transmitter or receiver is provided, or other chip.

In the example shown in FIG. 3, the characteristic impedance of a transmission line 330 is identified as "$Z_O$". In this embodiment, the parasitic capacitances of the wiring and the ESD device are represented at 320. This embodiment makes use of the preexisting parasitic capacitance as an element of the programmably adjustable RLC impedance matching circuit 300 at an interface to a transmission line. Here, a series programmably adjustable inductive element 350 is provided for this purpose. No extra pads or wire strips are required, making it cost effective and practical to implement. Adjustment of the inductance value of inductive element 350 is performed by programming signal input thereto, as is adjustment of the resistance value of resistive element 310. In this way, adjustments are made to programmably adjustable impedance matching circuit 300 to reduce or minimize the signal return loss.

In addition to a programmably adjustable inductive element as described above, other programmably adjustable elements such as programmably adjustable resistive elements and programmably adjustable capacitive elements can be used in conjunction with one another, to form a programmably adjustable impedance matching circuit. Values of resistance "R" and inductance "L" can be altered in this way to minimize the signal return loss. For example, the value of the inductance "L" can be set to $[C \times R \times Z_O]$, where "C" is the (parasitic) capacitance, "R" is the termination resistance and "$Z_O$" is the characteristic impedance 330 of the transmission line, as shown in FIG. 3.

The values "$Z_O$" and "R" do not need to be identical, but the relationship between "R" and "$Z_O$" do depend on the frequency, parasitic capacitance and inductance of the circuit. Since, "C" and "$Z_O$" are known, the following equations can be used to find the unknown variables "L" and "R":

$$[j\overline{\omega L} = 1/(j\overline{\omega C} = (1R))] = Z_O;$$

$$L/C = R*Z_O; \text{ and}$$

$$\text{therefore } R = Z_O/[1 - \overline{\omega}^2 LC].$$

impedance mismatches caused by inductance or capacitance of parasitic on-chip or package elements are countered by tuning the adjustable inductive element and/or the adjustable resistive element to a point which reduces signal loss caused by reflection.

An example may be helpful to illustrate this concept. Assuming a $Z_O$ value of 50 ohms, a matching termination resistor "R" value of 50 ohms, and a parasitic capacitance of 1 pF, the proper inductance is expected to be about 2.0 nH. The size of the calculated inductance is not prohibitive for an on-chip inductor element to be implemented on a chip or other microelectronic element in a cost effective manner. In this way, in a preferred embodiment of the invention, a programmably adjustable impedance matching circuit can be applied to wide bandwidth high speed input/output (I/O) circuits.

Figure 4A:
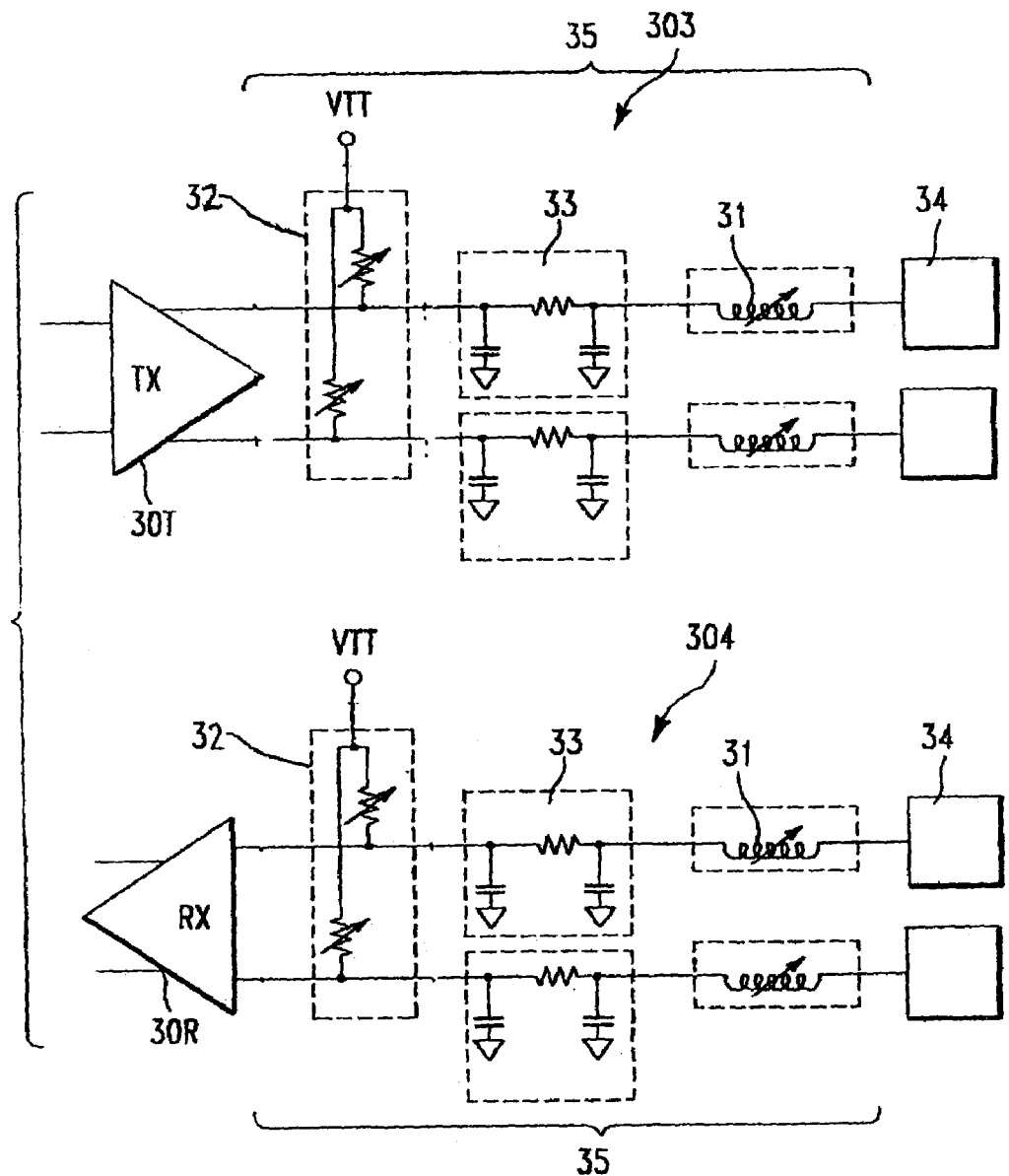
FIG. 4A is a schematic diagram further illustrating a first series inductance embodiment, for providing programmably adjustable impedance matching.

FIG. 4A illustrates in greater detail the transmission line interfaces to a transmitter and to a receiver as described above relative to FIG. 3. In transmitter circuit 303 and in the receiver circuit 304, a programmably adjustable inductive element 31 is placed in series with each conductor of the transmission line, which is preferably a differential signal line, between the chip pad 34 and the on-chip wiring 33. By having a separate programmably adjustable inductive element for each of the differential signal lines, the matching impedance can be adjusted independently for each. In FIG. 4A, a programmably adjustable impedance matching circuit 35 preferably comprises both a programmably adjustable resistive element 32 and a programmably adjustable inductive element 31.

The transmitter and the receiver shown in FIG. 4A operate in either direct current (DC) or alternating current (AC) coupled modes. In a DC coupled mode, the current from a transmitter 30T of FIG. 4A will be sunk partially at the source end (i.e. the transmitter 30T) of the transmission line, and partially to the load end (i.e. the receiver coupled to the transmission line). In an AC coupled mode in which there is either an on-chip or an off-chip blocking capacitor, the current from the source (transmitter 30T) end is sunk only into the source (transmitter) end. In AC mode, current flow is relatively low on the receiver end, such that the programmably adjustable inductive element 31 of the receiver 30R does not have electro-migration concerns. However, in the transmitter, the inductor coil of the programmably adjustable inductive element 31 must be designed to allow maximum current flow because more current is sunk to that side. Therefore, the programmably adjustable inductive element is preferably made larger on the transmitter end.

Figure 4B:
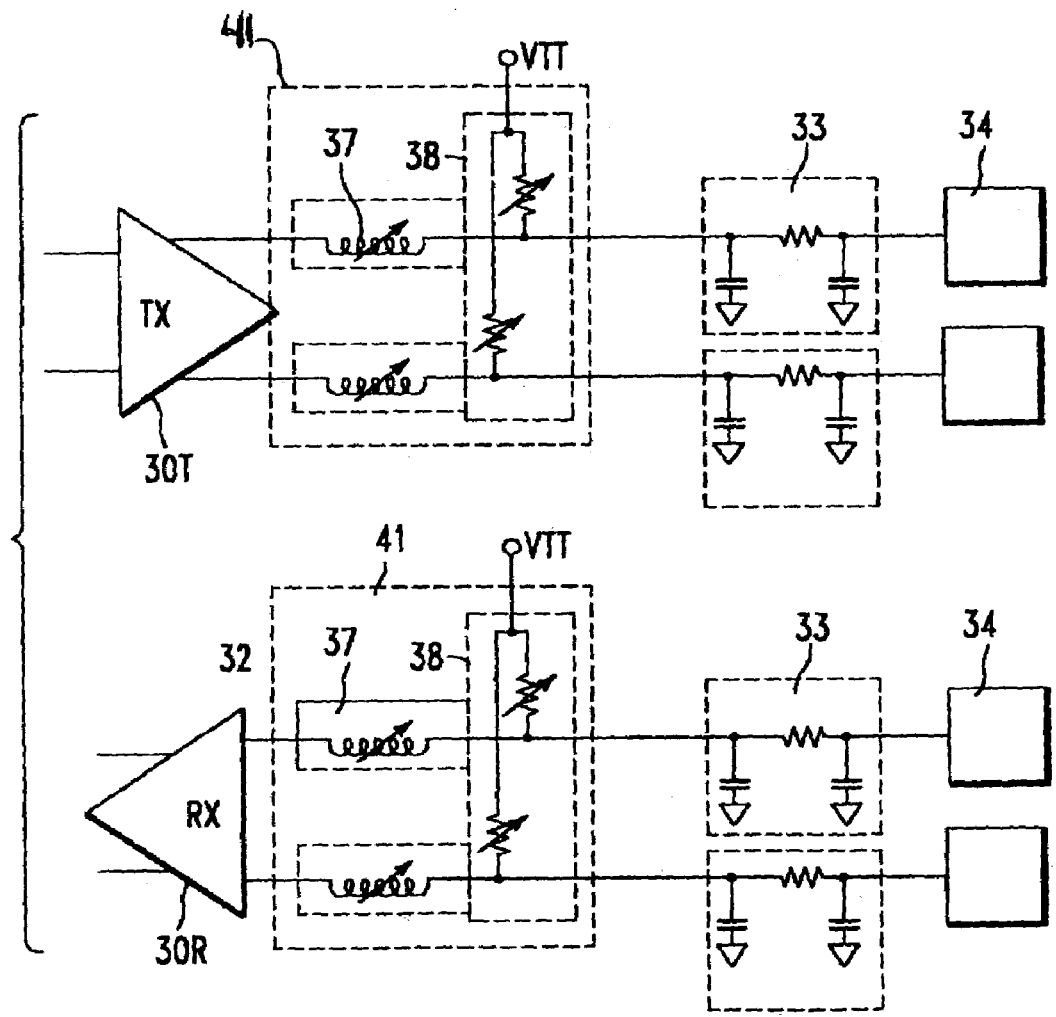
FIG. 4B is a schematic diagram further illustrating a second series inductance embodiment, for providing programmably adjustable impedance matching.

In FIG. 4B, in contrast to FIG. 4A, the programmably adjustable inductive element 37, an element of the programmably adjustable impedance matching circuit 41, is placed in series with each conductor of the transmission line, which is preferably a differential signal line, between the output of a transmitter 30T and a resistive termination element 38. The resistive termination element 38 is also preferably programmably adjustable, and independently adjustable for each of the differential signal lines. By having an independently programmably adjustable inductive element, and preferably an independently programmably adjustable resistive element, for each differential signal line, the matching impedance can be adjusted independently for each of the differential signal lines. Other resistance and capacitance between the transmitter 30 and chip pad 34 are modeled as element 33. In this way, the transmission line extending from the transmitter is terminated by a programmably adjustable impedance element 41 which can be programmably adjusted on the chip.

A similar arrangement is provided for the receiver 30R, in which a programmably adjustable inductive element 37 is placed in series with each conductor of the transmission line, which is preferably a differential signal line, between a resistive termination element 38, also preferably programmably adjustable, and the input of the receiver 30R. Again, resistance and capacitance on the transmission line between the chip pad 34 and the receiver 30R is modeled as element 33. As in FIG. 4A, in a preferred embodiment of FIG. 4B, the resistive element 38 does not have to be programmably adjustable, but most flexibility and most effectiveness is provided at higher frequencies if it is.

Figure 5A:
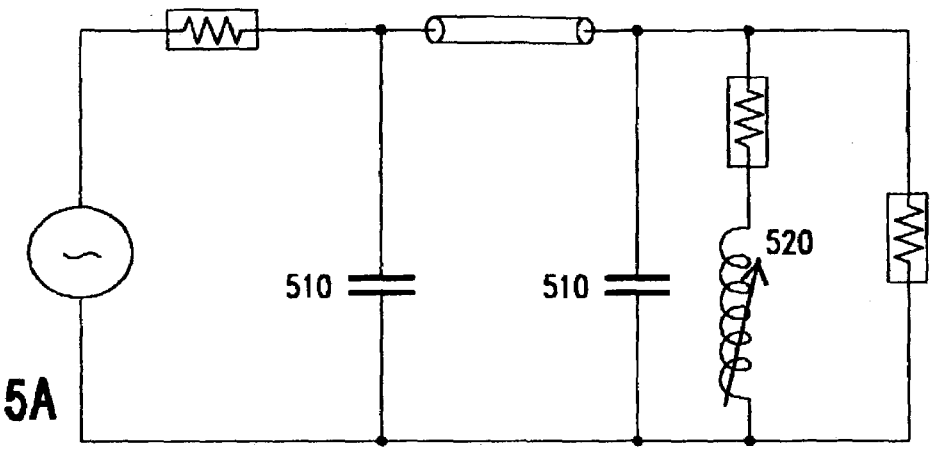
FIG. 5A is a schematic diagram illustrating a parallel inductance embodiment, for providing programmably adjustable impedance matching.

Another embodiment of the invention will now be described relative to FIG. 5A. Again, the circuitry is simplified for ease and simplicity of description. In this embodiment, the programmably adjustable inductive element 520 is placed in parallel with capacitive elements 510 which are essentially parasitic, i.e. unwanted in character. The embodiment of FIG. 5A is used most successfully to null out such parasitic capacitances at relatively high frequencies. A more specific schematic model of this embodiment is provided in FIG. 5B.

Figure 5B:
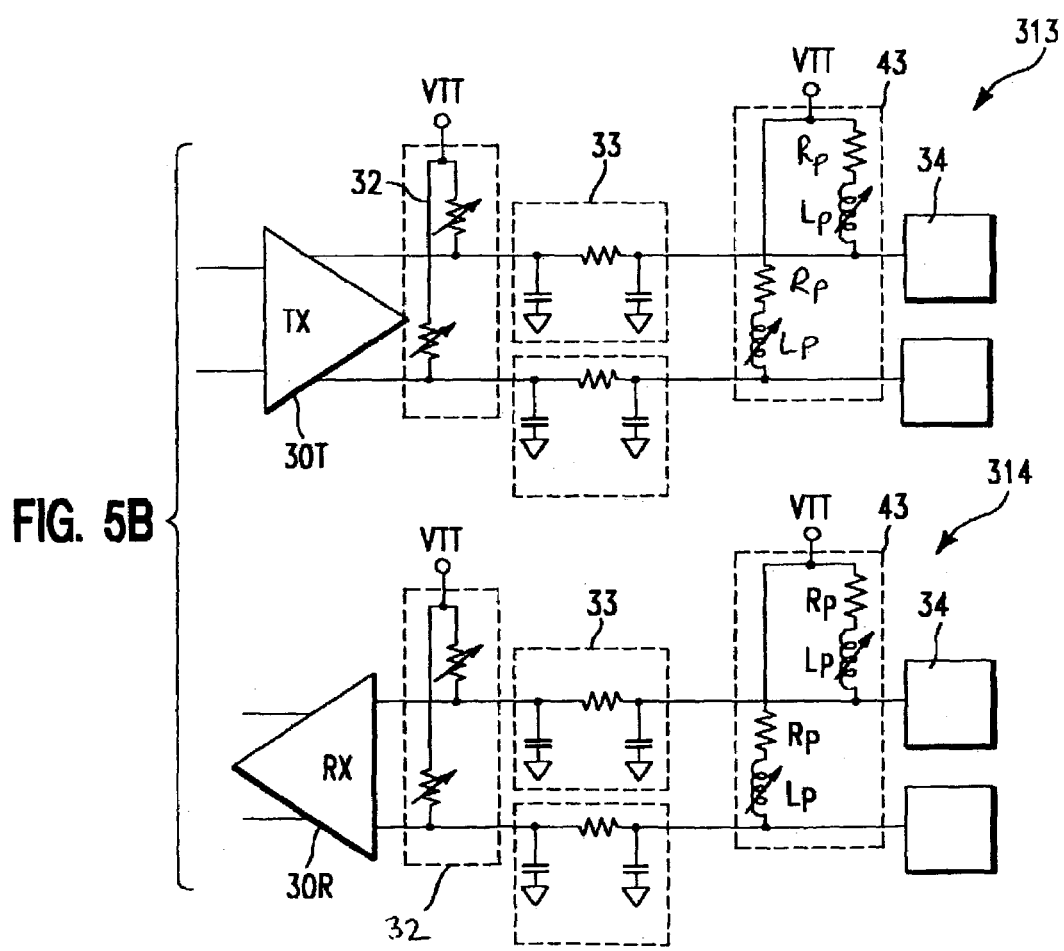
FIG. 5B is a schematic diagram further illustrating a parallel inductance embodiment, for providing programmably adjustable impedance matching.

In FIG. 5B, a programmably adjustable inductive element 43 is coupled in parallel to the parasitic shunt capacitance element 33 for both the transmitter 30T circuit 313, and the receiver 30R circuit 314. The programmably adjustable inductive element 43 is provided on each of a pair of transmission lines, which are preferably differential signal transmission lines, such that the inductance of the inductive element 43 can be adjusted independently for each of the transmission lines. The programmably adjustable inductive element includes resistive elements Rp to limit the current draw. These resistive elements Rp may themselves have programmably adjustable resistances, preferably being independently adjustable for each of the differential signal lines. Alternatively, resistive termination elements 32, preferably being independently adjustable for each of the differential signal lines, may be provided elsewhere in circuits 313 and 314. In this way, the matching impedances to transmission lines at the interfaces to the transmitter 30T and the receiver 30R are programmably adjustable on the chip.

Figure 6A:
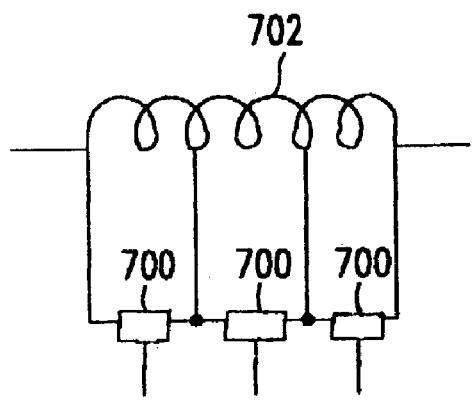
FIGS. 6A and 6B and 7 are schematic diagrams illustrating ways of implementing programmably adjustable inductive elements.
Figure 6B:
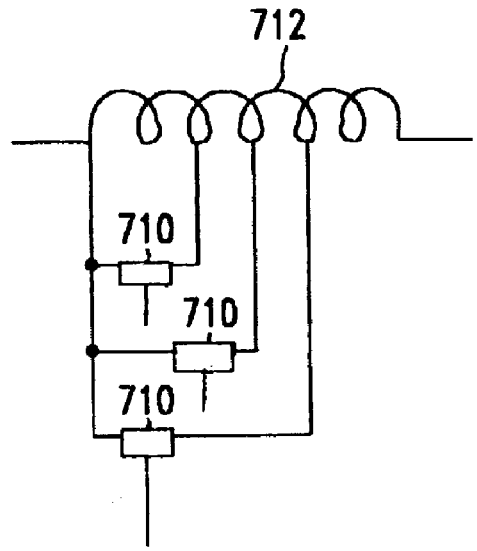
Figure 7:
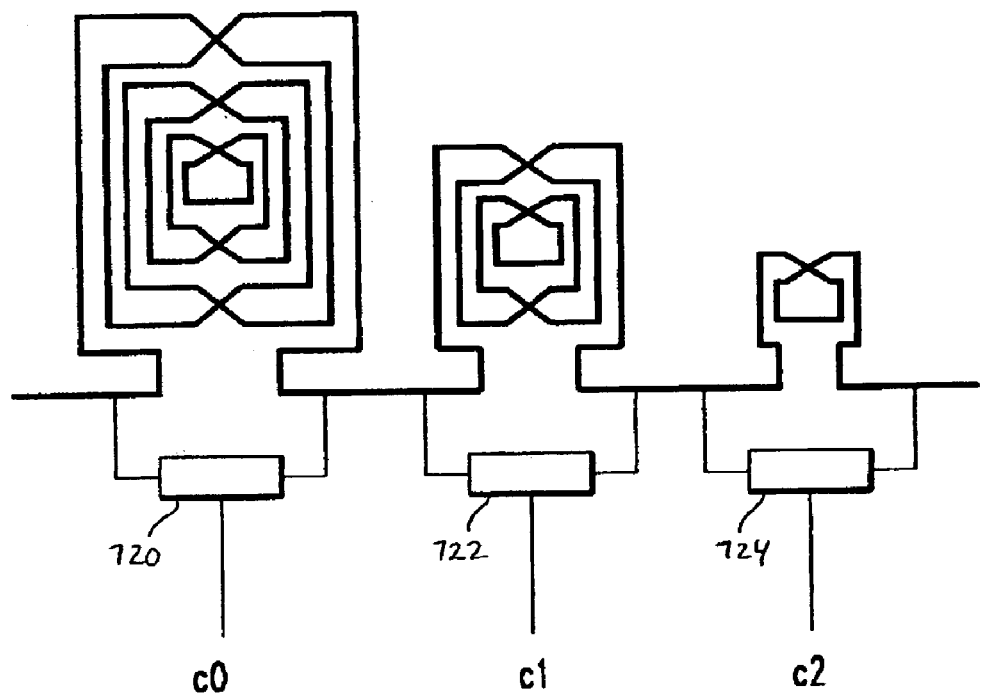

FIGS. 6A, 6B and 7 illustrate embodiments for implementing programmably adjustable inductive elements such as those shown in FIGS. 3 through 5. FIG. 6A illustrates one way in which the coils of a programmably adjustable inductive element 702 are separated into portions, allowing one or more portions to be selectively bypassed by switching means 700, each of which is coupled in parallel to a portion the inductive element 702. Switching means can be any microelectronic switching element capable of being controlled by electronic programming signal input. Switching means can be implemented on an integrated circuit, for example, by a transistor, e.g. a field effect transistor, or a micro-electromechanical (MEM) device, among others. For example, U.S. Pat. No. 6,396,368 B1 to Chow et al. describes a method of making MEM switches on an integrated circuit. By such switching means 700, the inductance is adjusted up or down by way of programmable control signals thereto.

FIG. 6B illustrates another way that different numbers of coils for the inductive element 712 can be selectively bypassed by way of switching means 710, which again, can be implemented in any of a variety of ways such as those described above. Switching means 700 and 710 can be configured in a way which allows for a linear progression of inductance, which has low insertion resistance, or by using binary selection, which allows for a larger logarithmic progression of inductance values, but which must tolerate a greater insertion resistance.

FIG. 7 is a plan view illustrating a layout of a series of bypassable fixed inductors for providing a programmably adjustable inductive element. The different values of fixed inductors connected in series provide for a graduated combination of values. For example, with three control signals c0, c1, and c2, provided to switching means 720, 724 and 726, eight different combinations of inductance values from 0 nH to 2.8 nH can be obtained. Again, the switching means 720–726 can be any kind of microelectronic switching element, for example, a transistor or a MEM switch, capable of being controlled by an electronic programming signal input thereto. As such, a programmably adjustable impedance matching circuit is provided, having a programmably adjustable inductive element programmed by digital control signals, that allows for tuning, e.g. on-chip tuning, of a matching impedance for terminating a transmission line.

Figure 8A:
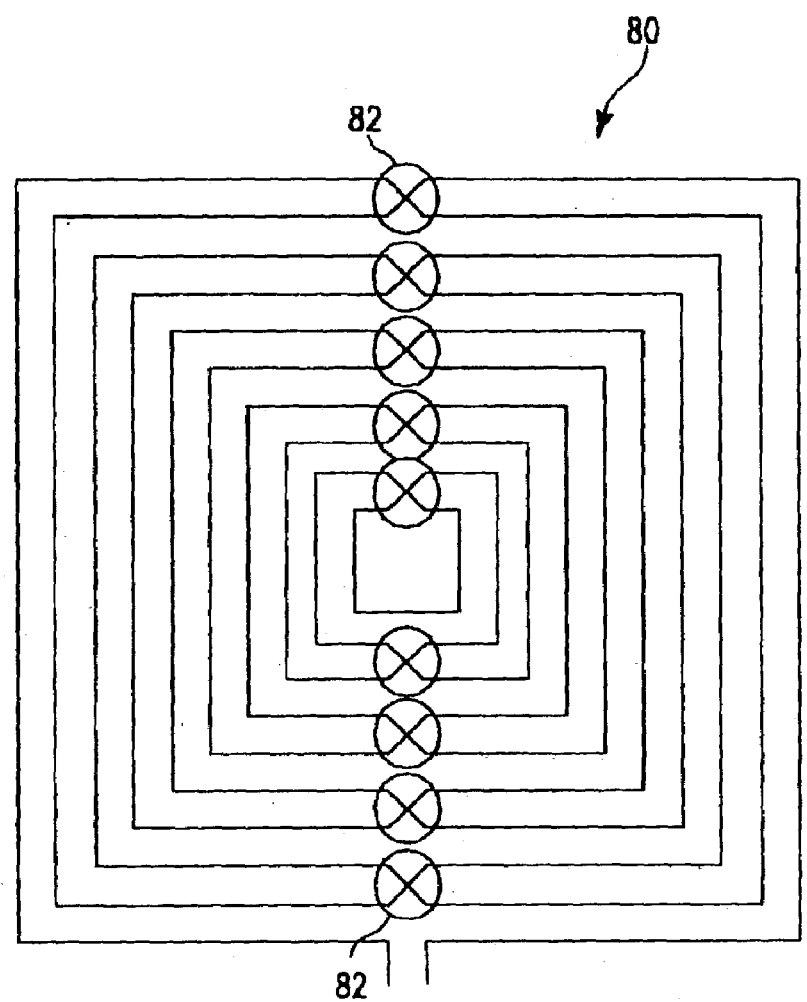
FIG. 8A is a plan view illustrating a programmably adjustable spiral inductive element having an adjustable inductance determined by the number of turns that are selectably coupled to the inductor.
Figure 8B:
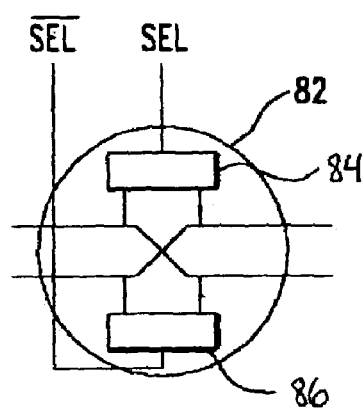
FIG. 8B is a schematic diagram further illustrating a mechanism for selectably coupling turns of the inductor shown in FIG. 8A.

In an embodiment shown in FIG. 8A, another way is shown for implementing a programmably adjustable inductive element 80. Inductance tuning is performed by initially selecting a certain number of inductor coils to be connected to the circuit, according to the amount of inductance needed from the programmably adjustable inductive element. FIG. 8A is a plan view illustrating a spiral inductor, such as may be fabricated on a chip or other device. In this case, the spiral inductor is a 10 turn programmably adjustable inductive element, having portions bypassable by means of switching means 84 and 86 operated by control signals SEL and its complement /SEL, at switching points 82 within the inductor 80, as shown in the inset FIG. 8B. By appropriately providing control signals SEL and /SEL to switching means 84, 86, etc., at switching points of the inductor 80, the number of selected turns of the programmably adjustable inductive element can be changed from 10 turns to just one turn, or any number of turns in between, while in each case, the remaining turns of the inductor 80 are bypassed. An advantage of this embodiment is the compact arrangement in which the same amount of chip area can be used to provide a full range of inductance values, as compared to using several inductors in series, in which larger inductance values require larger series inductive elements.

Figure 8C:
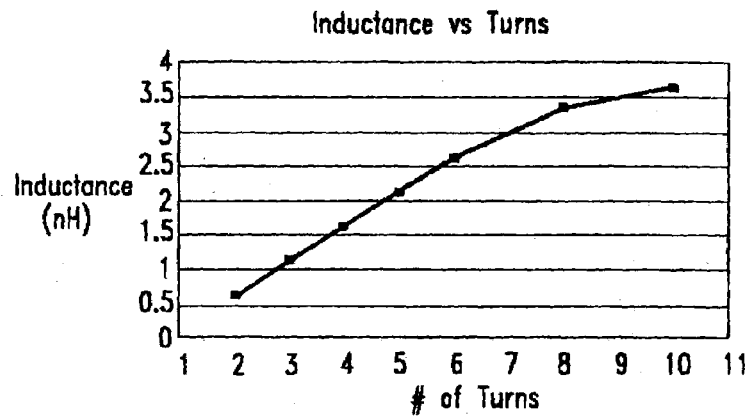
FIG. 8C is a graph illustrating a relationship between number of turns of the programmably adjustable spiral inductive element and its inductance.

FIG. 8C shows a plot of the inductance versus the number of turns. For this particular geometry as shown in FIG. 8A, the inductance of the programmably adjustable element ranges between 0.637 nH for 2 turns (shown at 102) and 3.632 nH for the full 10 turns (shown at 110). The inductance is nearly linear between 2 and 6 turns, with a 0.5 nH increase in inductance per turn added.

With the arrangement shown in FIG. 6A, 6B, 7 or 8A, the value of the programmably adjustable inductive element can be adjusted to address a variety of situations. For example, the amount of the selected inductance can be reduced if the on-chip wiring is shortened, or the package component has a higher inductive value, such as may arise when there is larger spacing between the bonding pad or ball of the chip and the contacting element of the package.

Having described ways of implementing programmably adjustable impedance matching elements, a variety of methods can be used to set the programmably adjustable impedance matching element to its correct or best settings, which can be referred to as impedance tuning. One way that adjustments can be optimized for performance is by use of a network parameter analyzer to determine return loss on the receiver and the transmitter networks.

Thus, in an example, a chip having a programmably adjustable impedance matching element is modeled together with its package. The package is modeled using a "pi" model as an L-C (inductive capacitive) circuit, having a lumped capacitance on a left leg representing a module ball of the package (600 fF), and the programmably adjustable inductive element and a lumped capacitance on the right leg representing the ESD protection circuit and wiring capacitance (1 pF). When the programmably adjustable inductive element is changed sequentially between values ranging from 0.5 nH to 2.5 nH, the effect of the changes is observed. It is determined here that by the XAUI specification for maintaining a 10 dB return loss to 2.5 GHz, only a single lumped 850fF capacitor can be supported in series with a 50 ohm termination resistor. This represents a starting point. When the pi model as described is analyzed, an inductor value of 0 nH does not provide an adequate matching impedance, as the return loss significantly exceeds the allowable limit. Then, as the inductance of the programmably adjustable inductive element is increased, the return loss is reduced until it passes specification for 1.5 nH. As the inductance is further incremented, the chip still passes the XAUI return loss specification to 2.5 GHz. However, the high frequency content of the signal begins to become degraded due to the filtering action of the series LC circuit. Thus, optimum tuning for this particular chip, which has on chip capacitance of 1 pF is 1.5 nH.

A alternative method for optimizing the impedance tuning is to measure the amount of jitter tolerance (either both deterministic jitter or random jitter) in the receiver, and the jitter output from the transmitter, as the inductance of the adjustable impedance matching element is varied between values.

Figure 9:
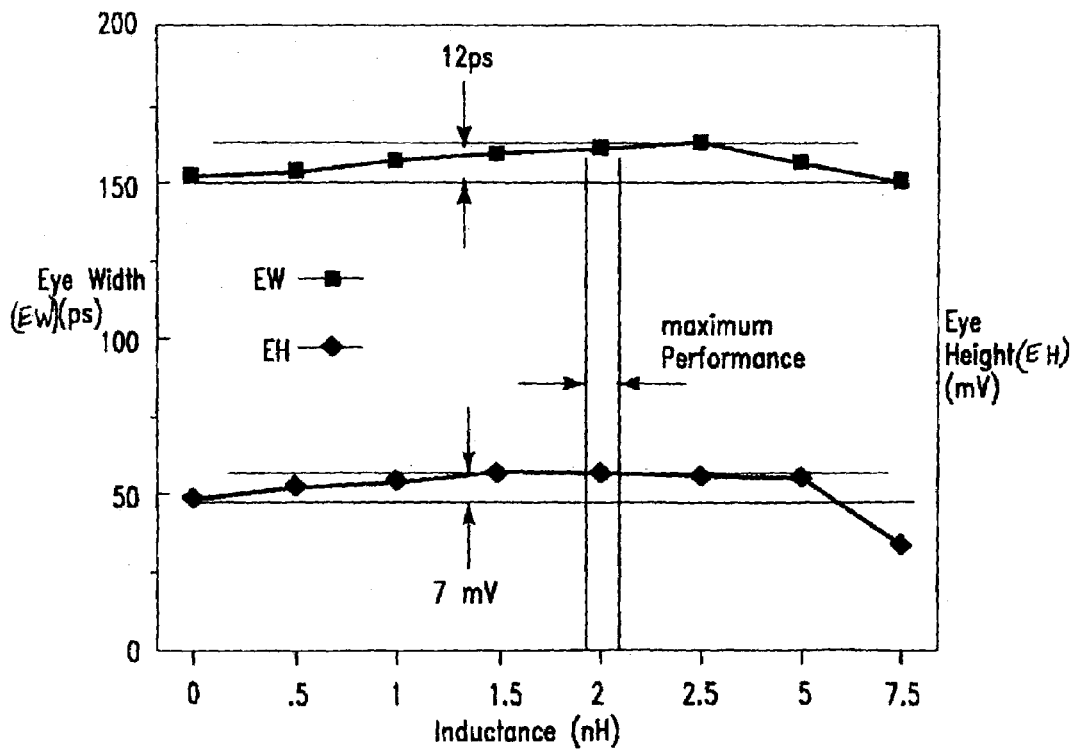
FIG. 9 is a diagram which graphs signal jitter for different values of an inductive element provided for impedance matching at the input to a receiver.

In an example, the focus of impedance tuning is by way of tuning an inductive element, at either a receiver or transmitter side of a high-speed chip installed in a package. The simulated example provides a transient analysis for a receiver as provided in FIG. 4A and operating at 1.25 GHz. As illustrated in FIG. 9, the eye size, in terms of both the eye height and eye width, is calculated for a receiver (transmitter could have been alternatively used) for different inductance values. At a frequency of 1.25 GHz, maximum performance is achieved when the eye is increased by about 12 ps in width and by 7 mV in height when the inductance of a programmably adjustable inductive element is tuned to between about 1.5 nH and 2 nH. This improvement can be enhanced even more at a higher frequency.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. An integrated circuit chip, comprising:
at least one signal contact pad exposed at an exterior of said chip for conductively interconnecting said chip with an external microelectronic element;
at least one of a receiver or a transmitter;
a transmission line coupled in a conductive path between said at least one signal contact pad and said at least one of a receiver or transmitter;
a programmably adjustable impedance matching circuit coupled to said transmission line for improving integrity of a signal carried by said transmission line, said impedance matching circuit including an inductive element having a programmable inductance value adjustable in response to a first control input and a resistive element having a programmable resistance value adjustable in response to a second control input, said programmable resistance value being adjustable independently from said programmable inductance value; and
programming means for supplying said first and second control inputs to said impedance matching circuit for adjusting said programmable inductance value and said programmable resistance value.

2. The integrated circuit chip of claim 1 wherein said impedance matching circuit is connected directly to said signal contact pad.

3. The integrated circuit chip of claim 1 wherein said impedance matching circuit includes switching means operable in response to said first control input for adjusting said programmable inductance value of said inductive element.

4. The integrated circuit chip of claim 3 wherein said inductive element includes a spiral inductor having a plurality of engageable portions, and said switching means is controllable in response to said first control input for selectively engaging one or more of said plurality of engageable portions.

5. The integrated circuit chip of claim 3 wherein said switching means includes at least a member selected from the group consisting of a transistor and a micro-electromechanical (MEM) device.

6. The integrated circuit chip of claim 3 wherein said inductive element includes a plurality of fixed length inductors, wherein said switching means is adapted to selectively couple one or more of said plurality of fixed length inductors to said transmission line.

7. The integrated circuit chip of claim 6 wherein at least some inductors of said plurality of fixed length inductors have different lengths.

8. The integrated circuit chip of claim 7 wherein said inductors having different lengths have a linear progression of inductance values.

9. The integrated circuit chip of claim 7 wherein said inductors having different lengths have a logarithmic progression of inductance values.

* * * * *